United States Patent [19]

DuVal et al.

[11] Patent Number: 4,515,396

[45] Date of Patent: May 7, 1985

[54] METHOD AND APPARATUS FOR DISPLAYING RECORDS

[76] Inventors: Daniel A. DuVal, 6765 Griffore Dr., Saginaw, Mich. 48604; Roger N. Kahn, 4680 Ashland, Saginaw, Mich. 48603; David E. Myers, 2823 Wiles St., Saginaw, Mich. 48602

[21] Appl. No.: 485,356

[22] Filed: Apr. 15, 1983

[51] Int. Cl.[3] ...................... B42D 15/00; B42D 11/00; G01D 9/00; G01R 13/00

[52] U.S. Cl. ............................ 281/15 R; 346/33 ME; 324/113; 281/16

[58] Field of Search ............... 128/697; 281/15 R, 16, 281/21 R; 282/22 R, 23 R; 283/900; 346/33 ME; 384/113

[56] References Cited

U.S. PATENT DOCUMENTS

| | | | |
|---|---|---|---|
| 2,549,976 | 3/1951 | Kraybill | 324/113 |
| 3,799,147 | 3/1974 | Adolph et al. | 346/33 ME |
| 3,978,491 | 8/1976 | Lenhart et al. | 346/33 ME |
| 4,085,407 | 4/1978 | Stratbucker et al. | 346/33 ME |

FOREIGN PATENT DOCUMENTS

| | | | |
|---|---|---|---|
| 1248458 | 4/1902 | France | 283/900 |

*Primary Examiner*—Paul A. Bell
*Assistant Examiner*—Paul M. Heyrana, Sr.
*Attorney, Agent, or Firm*—Krass & Young

[57] ABSTRACT

To analyze a human patient's heart activity over an extended period of time a portable EKG monitor is attached to the patient through electrodes and the patient maintains a diary of his activities and subjective feelings over a monitoring period. The recorded data is then used to form a graphic record consisting of a plurality of trace segments each representative of short consecutive intervals in the overall monitoring period. These records are necessarily to a very reduced scale and to allow the physician to obtain more detailed information regarding anomolous periods the graphic record is observed and various interesting segments are recorded on a substantially amplified scale. The first macroscopic and the second microscopic display segment are arranged in book form with the enlarged microscopic display segments on opposed pages from the macroscopic display segments to allow their simultaneous review and evaluation.

10 Claims, 3 Drawing Figures

METHOD AND APPARATUS FOR DISPLAYING RECORDS

DESCRIPTION

1. Field of the Invention

This invention relates to methods of recording a patient's electrical activity and particularly electro-cardiogram, and to displaying the recorded information in a convenient and meaningful manner for physician evaluation, the display record formed by the method.

2. Background of the Invention

Techniques for making graphic records of the electrical activity of the human patients such as electro-cardiograms representing the electric current produced by the contraction of the heart muscle or electroencephalograms representing the electrical currents developed in the brain are important tools for modern medical diagnosis. These recordings are often made over relatively short periods of time while the patient is inactive but recordings made over longer periods of time, such as 24 hours, while the patient is undergoing a normal range of activities, are more useful in detecting certain pathological phenomena such as heart irregularities which only occur for short periods of time during stressful activity. To develop records of EKGs and the like over long periods of time portable magnetic recorders are used which may be carried by the patient during normal activities and coupled to the patient by electrodes. The magnetic record is then used to generate a transient visual display on a cathode ray tube. A technician reviews the entire record and notes periods of the record during which anomolies occurred in the EKG. A pen recorder or the like is then used to generate a permanent visual display of the electrical trace during these anomalous intervals. The reviewing physician observes these traces and correlates them with the patient's activity during the monitored period, as recorded in a diary maintained by the patient, in order to evaluate the patient's condition.

This procedure deprives the physician of the opportunity to view the full information developed by the monitor since the decisions as to which sections of the electrical record are to be printed are made by a technician and the relationship between the sections thus printed and the other sections which are not printed may contain useful information as to the patient's condition. The obvious alternative of providing the reviewing physician with a printout of traces occurring during the entire recording period is unsatisfactory since the scale of the records produced are necessarily so small as to prevent full evaluation of the anomolies which the physician may then note.

SUMMARY OF THE PRESENT INVENTION

The present invention is accordingly directed toward a method of displaying the record produced by an EKG monitor of the like used over an extended period of time to provide the reviewing physician with the full information content developed by the monitor in a convenient manner that may be evaluated in a short period of time.

In the practice of the present invention, the EKG, EEG, or other electrical activity of the patient is recorded over an extended period of time in the conventional manner using a magnetic tape recorder or the like and the patient is requested to produce a diary of his activity and symptoms. The record of the electrical activity is then printed out as a series of relatively small scale traces each representative of a sequential segment during the period of monitoring. For example, the monitor may be worn for 24 hours and each trace may represent a one minute period during the 24 hours so that a complete record will consist of 1440 traces. These small scale traces are printed using a thermal recorder or the like on pages, each of which may contain, for example, 60 traces, representing the activity over one hour.

A technician reviews the traces to detect anomolous sections of the EKG activity and then replays the record and prints out traces generated during the periods noted at a much larger scale than the original records. These expanded scale tracings will typically cumulatively represent only a small fraction of the entire monitor period.

The full monitor tracings in small scale and the enlarged scale tracings of the anomolous sections are then arranged in book form with a page of the full record arranged in opposition to the enlarged anomolous traces derived from that portion of the full record. The small scale full time recordings and the larger scale anomolous sections are marked with the time of occurrence of the trace so that the physician can readily observe the position of the enlarged recording in terms of the overall monitor pattern. The booklet also includes the diary of the patient's activities and subjective symptoms made during the monitor period.

Using this booklet, the reviewing physician can quickly analyze the monitor record, evaluating the overall record as well as the detailed sections. In doing so the physician is reviewing the technicians decision as to which sections should be recorded on the amplified scale and can order amplified traces of other periods represented by the overall record as warranted.

Other objectives, advantages and applications of the present invention will be made apparent by the following detailed description of the preferred embodiment to the invention. The description makes reference to the accompanying drawings in which:

DETAILED DESCRIPTION OF THE DRAWINGS

Figure 1:
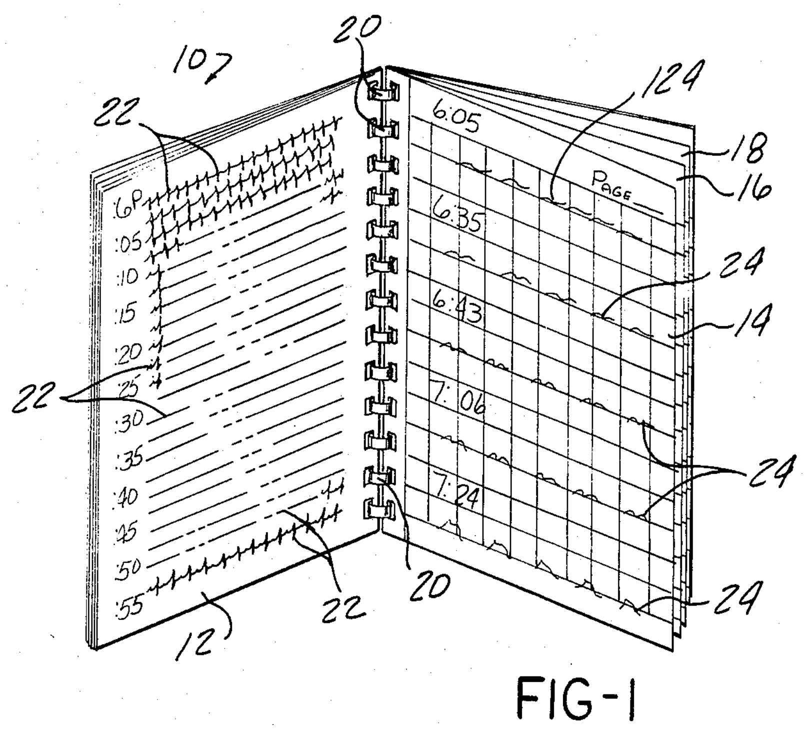
FIG. 1 is a perspective view of a book formed in accordance with a preferred embodiment of the present invention, incorporating detailed trace records of a monitored electrical activity of a patient over a monitoring period and amplified scale trace records of selected sections of the monitor record.
Figure 2:
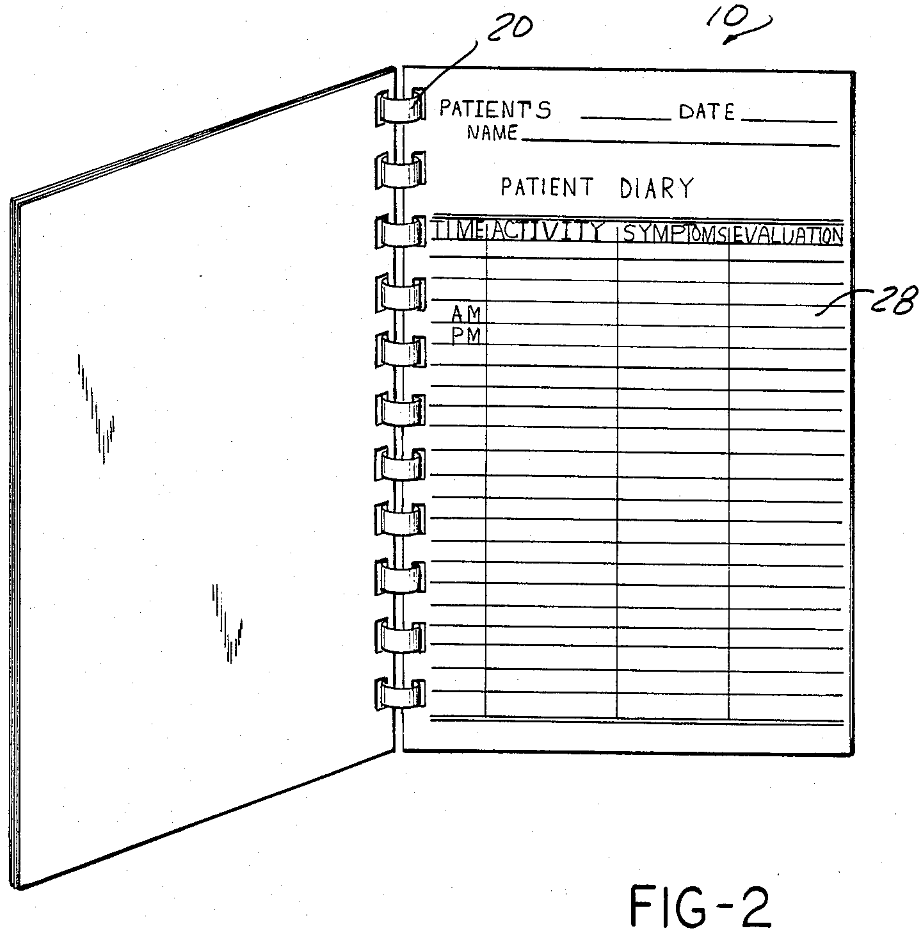
FIG. 2 is a view of one of the other pages of the book of FIG. 1 containing a patient diary.

Referring to the drawings, FIG. 1 and 2 illustrate a preferred form of the record produced by the method of the present invention taking the form of the book, generally indicated at 10 having a plurality of pages 12, 14, 16, 18 etc. which may be bound together with a conventional plastic binder 20 to allow the pages to be opened relative to one another. When the book 10 is opened to a particular location, the rear of one page 12 will be visible to the left as viewed in FIGS. 1 and 2 and the front of the next page 14 visible to the right.

The left page 12 will preferably contain a plurality of traces 22 which extend horizontally across the width of the page one above the other. These traces each represent short segments of the recording of a patient's EKG over a particular period such as one minute. For example, there may be 60 traces displayed on page 12 to present the full EKG record over one hour. The traces may be identified as to the time during the monitoring period that they represent. For example, the top trace represents the one minute period beginning at 6:00 p.m. Each successive trace is for a successive minute, with the bottom trace on the page representing 6:59. The second or reverse sides of the other pages in the book such as 14, 16, 18 etc. preferably include the detailed traces for successive times during the monitoring period, with each page containing the tracings for one hour, so that twenty-four pages will be required for a full twenty-four hour monitor period.

The traces 22 arre necessarily to a very small scale to allow their presentation in a compact and economical manner. They may be formed as ink recordings or thermal recordings on appropriate paper and are preferably adhered to the pages of the book.

The right hand side of the book, in this case the first or front side of page 14, will contain detailed tracings to a much larger scale, for example, a scale ten times as large as the scale of the tracings 22. These enlarged detailed tracings 24 represent amplified tracings of particular sections of the smaller scale complete tracings 22, as selected by a technician after viewing the tracings 22. They may typically represent periods of anomolous EKG activity. They are imprinted with numerals representing their time of occurrence during the monitor period so that they may be evaluated in connection with the complete tracings 22. The tracings 24 may typically be obtained from a strip recorder and adhered to the forward surface of page 14. It may not be convenient to place all of the detailed strip recordings 24 in opposition to their corresponding smaller scale recordings 22, requiring that one or more pages be turned in order to view the small scale recording from which a larger detail is amplified.

One of the pages of the book preferably contains a patient diary 28 in which a patient may record his activities during the monitor period, such as walking, sitting, sleeping and any symptoms that he noted during those periods. The physician may use this record in connection with the EKG tracings in his diagnosis.

Figure 3:
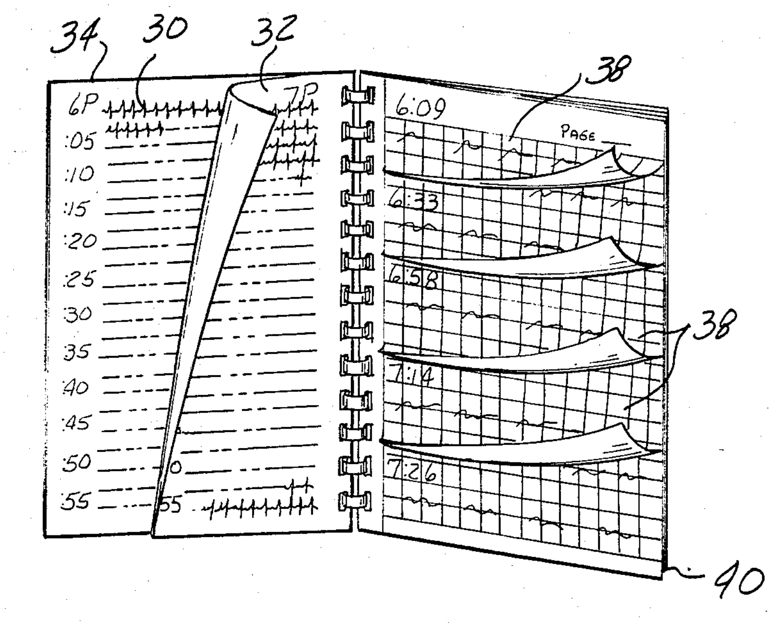
FIG. 3 is a perspective view of a book forming an alternative embodiment of the invention wherein the records supported on opposed pages of the book overlap one another so that multiple records may be stored in a minimal space.

FIG. 3 illustrates an alternative form of the invention wherein a series of pages of tracings such as the hourly tracings from 6:00 and 7:00 time periods 30 and 32, may be secured to a single page 34 in overlapping relationships so that either one may be referred to. Similarly the detailed tracings 36 and 38 may be attached to the right hand page 40 in overlapping relationship.

From this description it will be seen that the present invention provides a method of arranging small scale overall monitor traces and enlarged detail traces of anomolous sections in a convenient manner to allow the complete and convenient evaluation of the test results.

We claim:

1. A graphic record of electrical measurements of a biological subject made over a first relatively large period of time, the display comprising:

a first set of a plurality of display trace records of such electrical activity, each trace record representing the measured electrical activity of the subject over a second, relatively short period of time which is a devisor of said first period of time, with the first trace records being arranged in sequential order representative of their sequence of occurrence and cumulatively displaying the electrical activity over said entire first period of time; and a second set of display trace records each representative of a selected section of one of the first trace records, the scale of recording of the second trace records being substantially greater than the scale of the first trace records; and display means for arranging the second trace records in substantial opposition to the first trace records from which they were derived to allow analysis of the micro-activity represented by the second trace records in comparison to the macro-activity represented by the first trace records.

2. The record of claim 1 including markings associated with the first trace records and the second trace records indicative of the section of the first trace record to which a particular second trace record corresponds.

3. The record of claim 1 further including markings associated with the first and second trace records indicative of the time of original occurrence of the trace whereby the time relationship between the first and second may be observed.

4. The record of claim 1 wherein the first trace records cumulatively represent the recorded activity of the subject over the entire first period of time and the second trace records each represent the electrical activity over a short segment of said first period of time which is not contiguous with the periods represented by the other of said second trace records.

5. The record of claim 1 wherein the electrical activity constitutes the electrocardiogram activity of a human subject.

6. A graphic record of electrical measurements of a biological subject made over a first relatively large period of time, the display comprising:

a first set of a plurality of display trace records of such electrical activity, each trace record representing the measured electrical activity of the subject over a second, relatively short period of time which is a divisor of said first period of time with the first trace records being arranged in sequential order representative of their sequence of occurrence and cumulatively displaying the electrical activity over said entire first period of time;

a second set of display trace records each representative of a selected section of one of the first trace records, the scale of recording of the second trace records being substantially greater than the scale of the first trace records; and said first and second display trace records being arranged in a book consisting of a plurality of pages with a subset of said first trace records arranged on a page in opposition to a page containing the second display records derived from such first display records subset whereby the first display records and their associated second display records may be viewed simultaneously.

7. The record of claim 6 wherein said book includes a plurality of pages with said first trace records arranged on one side of each page and those second trace records associated with such first trace records arranged on the opposite side of the next page.

8. The record of claim 6 further including a diary section in the book recording the nature of the activity of the biological subject during various segments of the period of recording.

9. The method of displaying records of the electrical activity measured from a biological subject over a period of time, comprising:

generating a first graphic record of the activity over the entire period of time in the form of a first set of traces representative of sequential intervals during said period of time;

analyzing said first graphic record to select sections representing time periods of special interest;

generating a second set of traces representing the electrical activity during said periods of special interest on an amplified scale relative the scale of said first set of traces; and respectively positioning each of said second set of traces on opposed pages relative to the traces of said first set of traces from which that second trace was derived to allow simultaneous inspection of the macroscopic electrical activity of the subject as represented by the first traces and the microscopic electrical activity of the subject as represented by the second traces.

10. The method of analyzing the electrical activity of a biological subject over a period of time, comprising:

attaching recording apparatus to the subject through electrodes and making a record of the subject's electrical activity over said period of time;

using the record of the subject's activity to generate a plurality of pages of a graphic display of electrical activity, each page consisting of a plurality of segments representing sequential intervals of said period of time;

analyzing the displayed record to detect selected segments of the record deemed to be worthy of more detailed examination;

generating second display segments on a substantially amplified scale relative to the scale of the first display segments for each of the selected first display segments; and positioning the second display segments in a book on pages in opposition to the respective first display segments from which the particular second display segments were derived so that the corresponding first and second display segments may be viewed substantially simultaneously, the first display segments representing a macroscopic display of the electrical activity of the patient during said period and the second display segments representing a microscopic display of selected segments of the record.

* * * * *